(12) United States Patent
Cho

(10) Patent No.: US 9,780,018 B2
(45) Date of Patent: Oct. 3, 2017

(54) POWER SEMICONDUCTOR PACKAGE HAVING REDUCED FORM FACTOR AND INCREASED CURRENT CARRYING CAPABILITY

(71) Applicant: Infineon Technologies Americas Corp., El Segundo, CA (US)

(72) Inventor: Eung San Cho, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/921,707

(22) Filed: Oct. 23, 2015

(65) Prior Publication Data

US 2016/0172283 A1    Jun. 16, 2016

Related U.S. Application Data

(60) Provisional application No. 62/092,753, filed on Dec. 16, 2014.

(51) Int. Cl.
*H01L 29/12*    (2006.01)
*H01L 23/495*    (2006.01)

(52) U.S. Cl.
CPC .. *H01L 23/49575* (2013.01); *H01L 23/49517* (2013.01); *H01L 23/49524* (2013.01); *H01L 23/49562* (2013.01); *H01L 2224/40137* (2013.01); *H01L 2224/48091* (2013.01); *H01L 2224/73265* (2013.01); *H01L 2924/0002* (2013.01); *H01L 2924/00014* (2013.01)

(58) Field of Classification Search
CPC ..................... H01L 21/8234; H01L 23/49575
USPC .................................................. 257/76, 499
See application file for complete search history.

(56) References Cited

U.S. PATENT DOCUMENTS

| | | | |
|---|---|---|---|
| 4,964,818 A | * | 10/1990 | Weatherley .......... H01R 12/727 439/741 |
| 2005/0161785 A1 | * | 7/2005 | Kawashima ...... H01L 23/49562 257/678 |
| 2008/0258278 A1 | * | 10/2008 | Ramos .................... H01L 24/36 257/676 |

(Continued)

FOREIGN PATENT DOCUMENTS

| EP | 2477222 | 7/2012 |
|---|---|---|
| EP | 2525394 | 11/2012 |

OTHER PUBLICATIONS

Extended European Search Report from counterpart European Application No. 15192672.2, dated Mar. 6, 2016, 9 pp.

(Continued)

*Primary Examiner* — Jami M Valentine
(74) *Attorney, Agent, or Firm* — Shumaker & Seiffert, P.A.

(57) ABSTRACT

A power semiconductor package is disclosed. The power semiconductor package includes a leadframe having partially etched segments and at least one non-etched segment, a first semiconductor die having a first power transistor and a driver integrated circuit (IC) monolithically formed thereon, a second semiconductor die having a second power transistor, wherein the first semiconductor die and the second semiconductor die are configured for attachment to the partially etched segments, and wherein the partially etched segments and the at least one non-etched segment enable the first semiconductor die to be coupled to the second semiconductor die by a legless conductive clip.

20 Claims, 5 Drawing Sheets

(56) References Cited

U.S. PATENT DOCUMENTS

2012/0061813 A1  3/2012  Ho
2013/0154073 A1  6/2013  Massie
2015/0130036 A1  5/2015  Cho
2015/0162303 A1  6/2015  Cho

OTHER PUBLICATIONS

U.S. Appl. No. 13/303,578, filed Nov. 23, 2011, Clavette.
Response to European Office Action dated Nov. 7, 2016, from counterpart European Application No. 15192672.2, Response filed on Jan. 5, 2017, 57 pp.
Examination Report from counterpart European Application No. 15192672.2, dated Aug. 4, 2017, 4 pp.

* cited by examiner

POWER SEMICONDUCTOR PACKAGE HAVING REDUCED FORM FACTOR AND INCREASED CURRENT CARRYING CAPABILITY

The present application claims the benefit of and priority to a provisional patent application entitled "Small Form Factor Power Converter Package with Integrated Power Transistors," Ser. No. 62/092,753 filed on Dec. 16, 2014. The disclosure in this provisional application is hereby incorporated fully by reference into the present application.

BACKGROUND

Power converters, such as buck converters, are commonly utilized to convert a high DC voltage to a low DC voltage. A power converter typically includes a high-side switch and a low-side switch connected in a half-bridge configuration. The power converter can include a driver integrated circuit (IC) to control a duty cycle of either or both of the high-side and low-side switches so as to convert a high input voltage to a low output voltage. To improve form factor, performance, and manufacturing cost, it is often desirable to integrate components of a power converter circuit, such as a half-bridge based DC-DC converter or a voltage converter, into a compact power semiconductor package.

In a conventional power semiconductor package, individual semiconductor dies are arranged side by side and coupled to a substrate through their corresponding conductive clips, which can undesirably increase electrical resistance and form factor of the power semiconductor package. Also, package design rules to successfully accommodate multiple leadframes and a conductive clip require a large degree of tolerance (i.e. a large clearance space) for manufacturing. Typically, a conductive clip having a leg portion is used to provide sufficient clearance space for necessary electrical connections. However, it is difficult to manufacture the leg portion of the conductive clip to match the exact height of the semiconductor devices in the conventional power semiconductor package. As a result, the leg portion may cause the conductive clip to tilt either toward or away from the semiconductor device, which in turn can cause unreliable electrical connection between the conductive clip and the semiconductor device, and limiting the current carrying capability of the conductive clip. Additionally, the increased package complexity resulting from the use of multiple conductive clips may negatively affect manufacturing time, cost, and package yields.

Thus, there is a need in the art to provide a compact power semiconductor package to with reduced form factor and increased current carrying capability.

SUMMARY

The present disclosure is directed to a power semiconductor package with reduced form factor and increased current carrying capability, substantially as shown in and/or described in connection with at least one of the figures, and as set forth in the claims.

DETAILED DESCRIPTION

Figure 1:
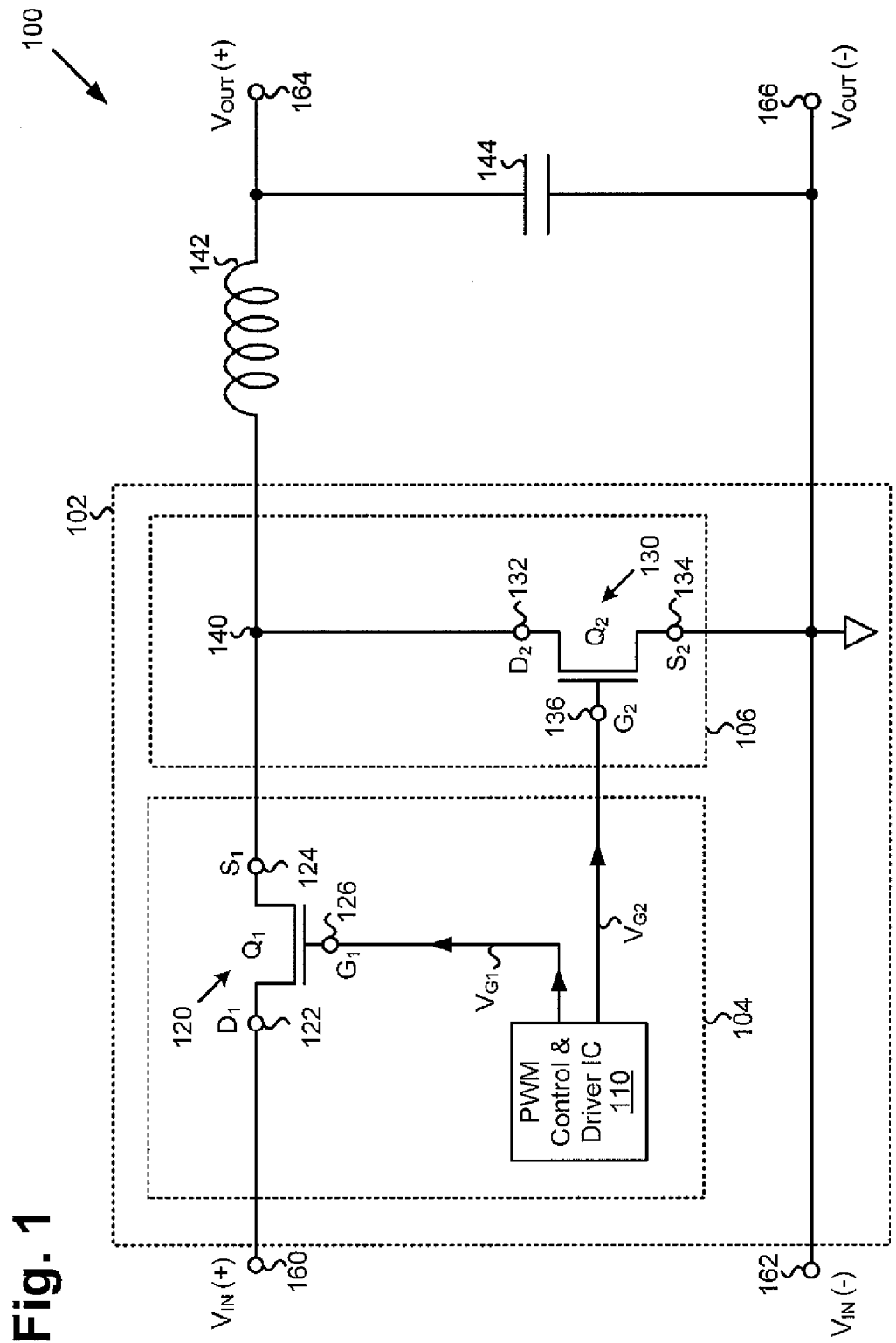
FIG. 1 illustrates an exemplary circuit diagram of a power converter, according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates an exemplary circuit diagram of a power converter, according to one implementation of the present application. In the present implementation, power converter circuit 100 includes a buck converter configured to convert a high input voltage to a low output voltage, for example. In another implementation, power converter circuit 100 may include electronic circuits and systems for conversion of a low input voltage to a high output voltage. As illustrated in FIG. 1, power converter circuit 100 includes half-bridge 102 having driver IC 110, power switch 120 and power switch 130, and an output stage having output inductor 142 and output capacitor 144.

As illustrated in FIG. 1, power switch 120 includes a high-side or control transistor having drain 122, source 124 and gate 126. Power switch 130 includes a low-side or synchronous (hereinafter "sync") transistor having drain 132, source 134 and gate 136. Drain 122 of power switch 120 is coupled to positive input terminal 160, $V_{IN(+)}$, while source 124 of power switch 120 is coupled to switched node 140. Gate 126 of power switch 120 is coupled to driver IC 110, which provides a high-side drive signal ($V_{G1}$) to gate 126. As illustrated in FIG. 1, drain 132 of power switch 130 is coupled to switched node 140, while source 134 of power switch 130 is coupled to negative input terminal 162, $V_{IN(-)}$. Gate 136 of power switch 130 is coupled to driver IC 110, which provides a low-side drive signal ($V_{G2}$) to gate 136.

In an implementation, at least one of power switch 120 and power switch 130 includes a field effect transistor (FET), such as a silicon metal-oxide-semiconductor FET (MOSFET). In another implementation, at least one of power switch 120 and power switch 130 includes a group III-V semiconductor device, such as a gallium nitride (GaN) device, which can be a GaN high electron mobility transistor (HEMT). In other to implementations, power switches 120 and 130 may be any other suitable control devices, such as bipolar junction transistors (BJTs) and insulated gate bipolar transistors (IGBTs).

According to the present implementation, driver IC 110 and power switch 120 are monolithically integrated on semiconductor die 104, and power switch 130 is formed on semiconductor die 106. As discussed with reference to FIGS. 2A, 2B, 2C and 3 below, semiconductor dies 104 and 106 are coupled to each other by a legless conductive clip, and are configured for attachment to partially etched segments of a leadframe in a power semiconductor package.

Figure 2A:
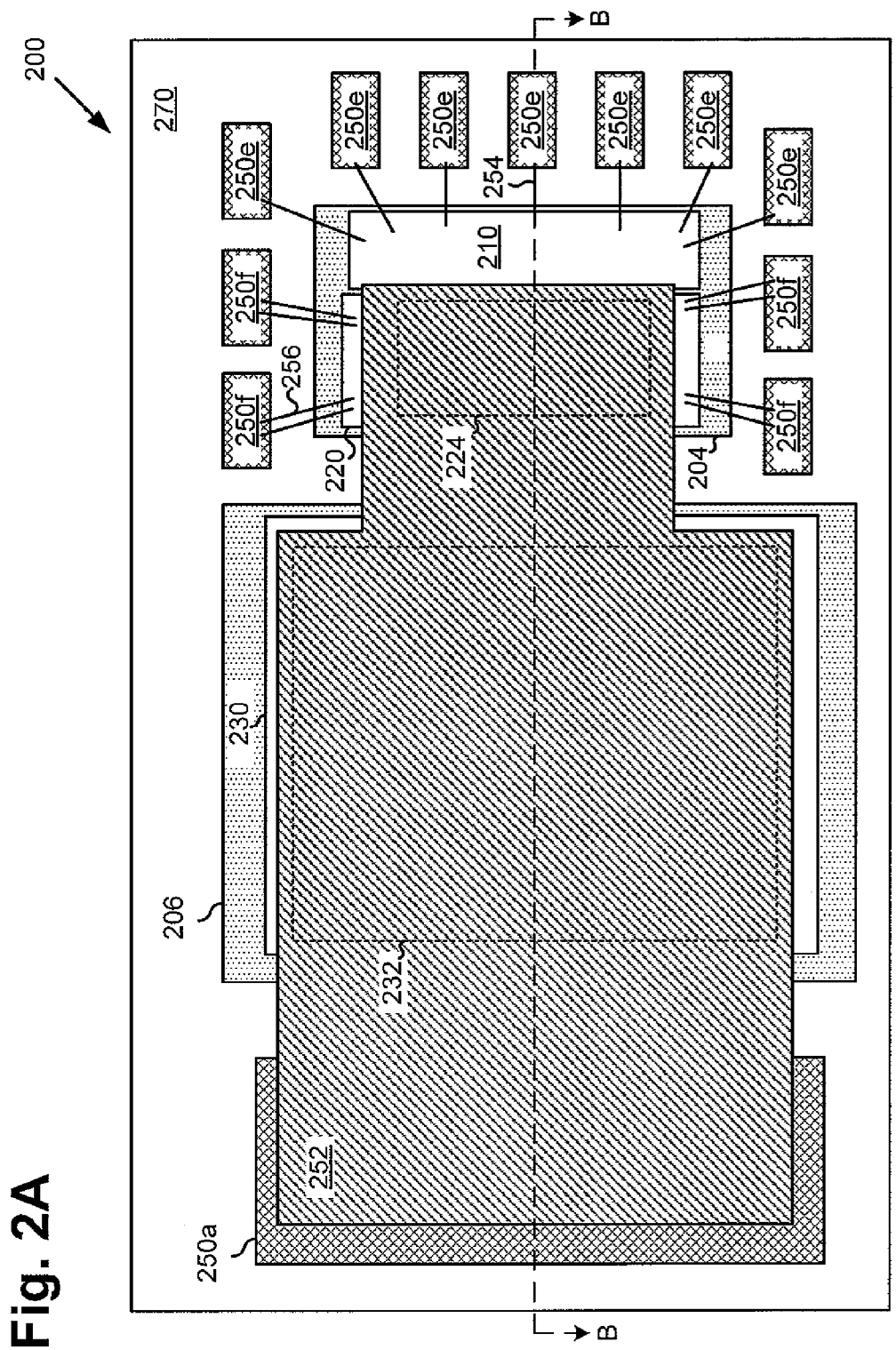
FIG. 2A illustrates a top plan view of an exemplary power semiconductor package, according to one implementation of the present application.
Figure 2B:
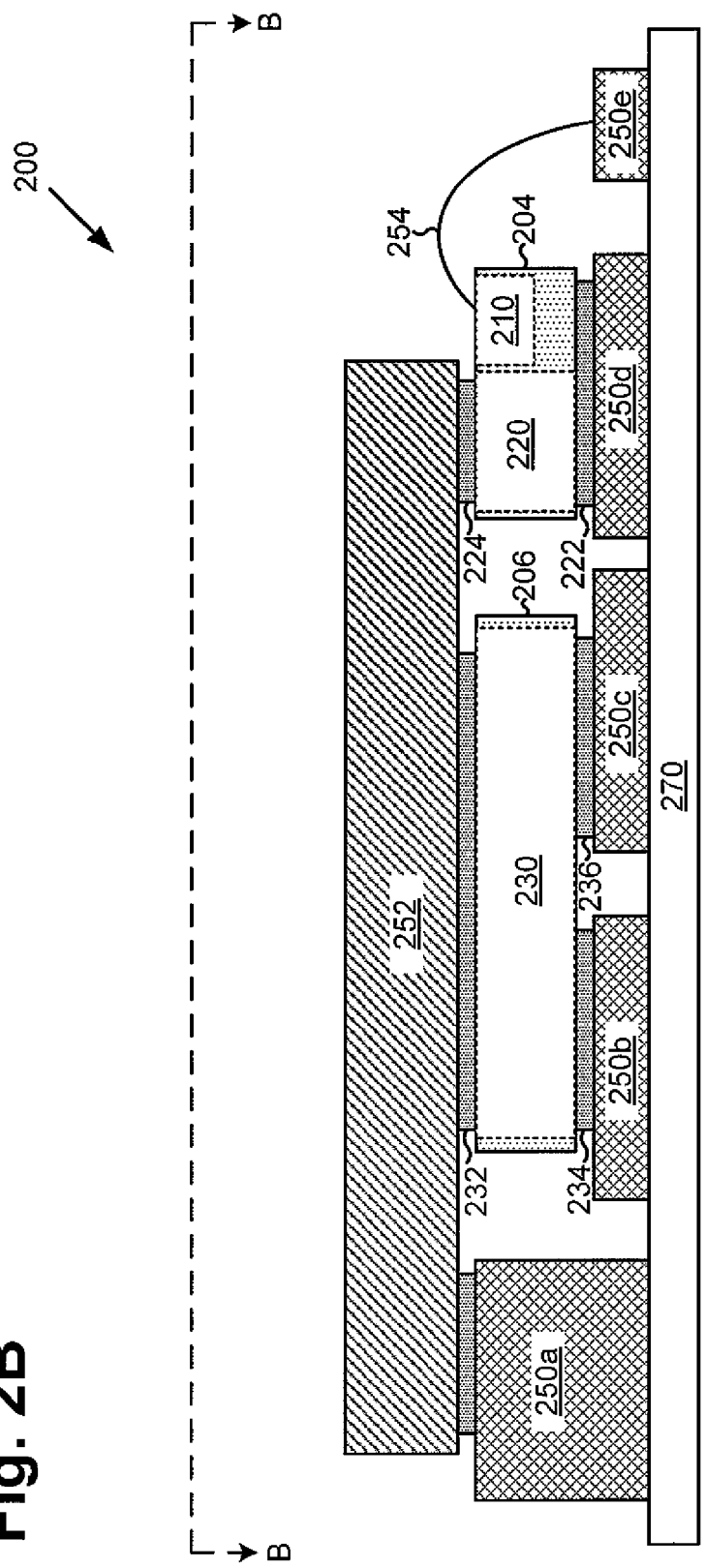
FIG. 2B illustrates a cross-sectional view of an exemplary power semiconductor package, according to one implementation of the present application.
Figure 2C:
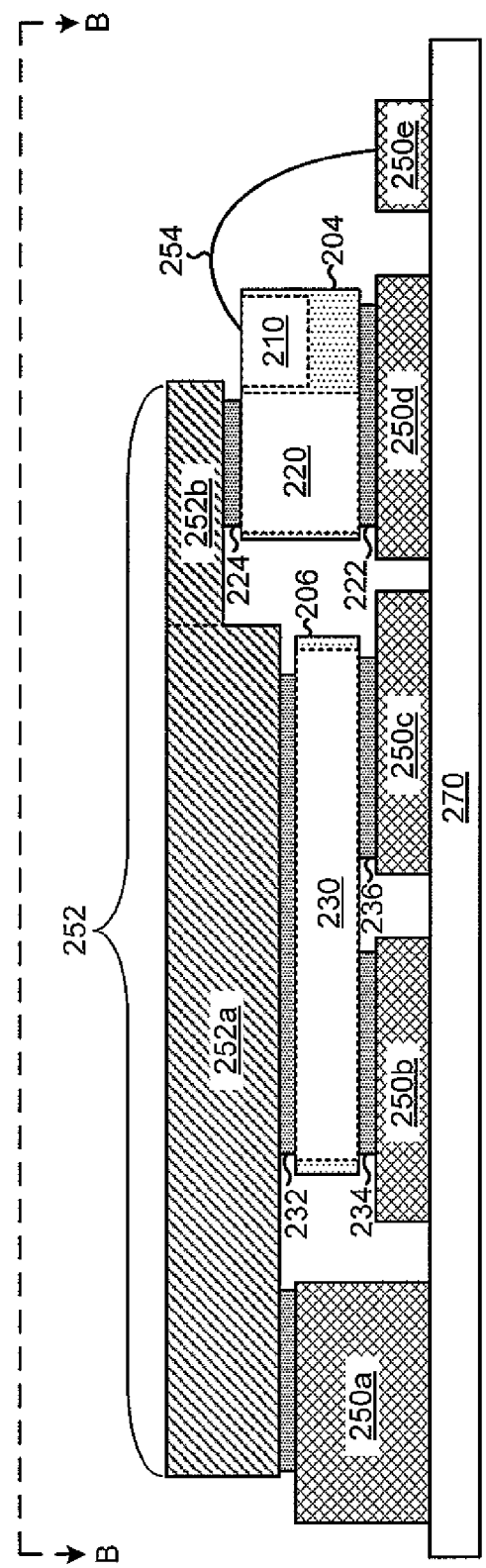
FIG. 2C illustrates a cross-sectional view of an exemplary power semiconductor package, according to one implementation of the present application.

With reference to FIGS. 2A, 2B and 2C, implementations of the present application are described with respect to a power semiconductor package, such as power semiconductor package 200, where driver IC 210 and power switch 220 on semiconductor die 204, and power switch 230 on semiconductor die 206 may correspond to driver IC 110 and power switch 120 on semiconductor die 104, and power switch 130 on semiconductor die 106, respectively, in power converter circuit 100 of FIG. 1, and are connected as such.

Turning to FIG. 2A, FIG. 2A illustrates a top plan view of an exemplary power semiconductor package, according to one implementation of the present application. As illustrated in FIG. 2A, power semiconductor package 200 includes semiconductor die 204 having power switch 220 and driver IC 210 monolithically formed thereon, semiconductor die 206 having power switch 230, legless conductive clip 252 electrically coupling semiconductor die 204 to semiconductor die 206, and substrate 270. Power semiconductor package 200 also includes a leadframe having at least one non-etched segment (e.g., non-etched segment 250a) and partially etched segments (e.g., partially etched segments 250e and 250f). It is noted that the at least one non-etched segment and the partially etched segments in each of FIGS. 2A, 2B and 2C are collectively referred to as leadframe 250.

In the present implementation, semiconductor die 204 includes driver IC 210 and power switch 220 monolithically formed thereon. Driver IC 210, power switch 220 and semiconductor die 204 may correspond to driver IC 110, power switch 120 and semiconductor die 104, respectively, in power converter circuit 100 of FIG. 1. As illustrated in FIG. 2A, power switch 220 includes a control transistor having power electrode 224 (e.g., source electrode) situated on a top surface of semiconductor die 204, and a power electrode (e.g., drain electrode) (not explicitly shown in FIG. 2A) situated on a bottom surface of semiconductor die 204. Power switch 220 also includes a control electrode (e.g., gate electrode) (not explicitly shown in FIG. 2A), which may be situated on either the top or bottom surface of semiconductor die 204.

In the present implementation, the power electrode (e.g., drain electrode) of power switch 220 at the bottom of semiconductor die 204 is electrically coupled to an input voltage (e.g., $V_{In(+)}$ at positive input terminal 160 in FIG. 1) through one or more bond wires 256 and one or more partially etched segments 250f of leadframe 250. For example, one or more bond wires 256 may be coupled to the power electrode (e.g., drain electrode) of power switch 220 at the bottom of semiconductor die 204 through one or more through-substrate vias (not explicitly shown in FIG. 2A) in semiconductor die 204. The power electrode (e.g., drain electrode) of power switch 220 at the bottom of semiconductor die 204 is configured for attachment to one or more partially etched segments (not explicitly shown in FIG. 2A) of leadframe 250. In the present implementation, the control electrode (e.g., gate electrode) (not explicitly shown in FIG. 2A) of power switch 220 may be electrically coupled to driver IC 210 through one or more bond wires 254, partially etched segments 250e and conductive traces (not explicitly shown in FIG. 2A) on substrate 270, for example. As illustrated in FIG. 2A, power electrode 224 (e.g., source electrode) of power switch 220 is electrically coupled to power electrode 232 (e.g., drain electrode) of power switch 230 through legless conductive clip 252, which may correspond to switched node 140 in FIG. 1. Legless conductive clip 252 is electrically coupled to substrate 270 through non-etched segment 250a of leadframe 250.

In the present implementation, driver IC 210 is formed on semiconductor die 204, and includes I/O pads (not explicitly shown in FIG. 2A) electrically coupled to one or more partially etched segments 250e of leadframe 250 through one or more bond wires 254 in FIG. 2A. Driver IC 210 is configured to provide drive signals to the gates of power switch 220 and power switch 230, for example, through one or more bond wires 254, partially etched segments 250e and conductive traces (not explicitly shown in FIG. 2A) on substrate 270.

In contrast to conventional power semiconductor packages having the driver IC and power switches formed side by side on separate semiconductor dies, the monolithic integration of power switch 220 with driver IC 210 on semiconductor die 204 can advantageously reduce the form factor of power semiconductor package 200. As can be seen in FIG. 2A, power switch 220 has a smaller footprint than that of power switch 230. Thus, integrating driver IC 210 and power switch 220 on the same semiconductor die can reduce the form factor of power semiconductor package 200 more effectively than integrating driver IC 210 and power switch 230 on the same semiconductor die, because the integration of driver IC 210 and power switch 220 on semiconductor die 204 can result in semiconductor die 204 having a footprint smaller than the combined footprint of two separate semiconductor dies, if driver IC 210 and power switch 220 were separately formed on those semiconductor dies.

As illustrated in FIG. 2A, semiconductor die 206 includes power switch 230. semiconductor die 206 and power switch 230 may correspond to semiconductor die 106 and power switch 130, respectively, in power converter circuit 100 of FIG. 1. Power switch 230 includes a sync transistor having power electrode 232 (e.g., drain electrode) situated on a top surface of semiconductor die 206, and a power electrode (e.g., source electrode) and a control electrode (e.g., gate electrode) situated on a bottom surface of semiconductor die 206 (not explicitly shown in FIG. 2A). In the present implementation, power electrode 224 (e.g., source electrode) of power switch 220 is electrically coupled to power electrode 232 (e.g., drain electrode) of power switch 230 through legless conductive clip 252, which may correspond to switched node 140 in FIG. 1. Legless conductive clip 252 is in turn electrically coupled to substrate 270 through non-etched segment 250a of leadframe 250.

In addition to non-etched segment 250a and partially etched segments 250e and 250f shown in FIG. 2A, leadframe 250 also includes partially etched segments 250b and 250c under semiconductor die 206 and partially etched segment 250d under semiconductor die 204, where partially etched segments 250b, 250c and 250d are shown in FIGS. 2B and 2C. Non-etched segment 250a and partially etched segments 250b, 250c, 250d, 250e and 250f are different portions of leadframe 250, where non-etched segment 250a retains the full thickness of leadframe 250, and partially etched segments 250b, 250c, 250d, 250e and 250f are etched, thus having a fraction of the full thickness of leadframe 250 (e.g., a half or a quarter of the thickness of non-etched segment 250a). Non-etched segment 250a and partially etched segments 250b, 250c, 250d, 250e and 250f of leadframe 250 are physically separated from one another. In the present implementation, non-etched segment 250a and partially etched segments 250b, 250c, 250d, 250e and 250f are made of the same material, and have a substantially uniform composition. In another implementation, non-etched segment 250a and partially etched segments 250b, 250c, 250d, 250e and 250f can be made of different materials, and have different compositions. In the present implementation, partially etched segments 250b, 250c, 250d, 250e and 250f have a substantially uniform thickness that is a fraction of the full thickness of non-etched segment 250a. In another implementation, partially etched segments 250b, 250c, 250d, 250e and 250f can have different thicknesses. In one implementation, segments 250e and 250f of leadframe 250 may be non-etched segments.

Since semiconductor dies 204 and 206 are situated on partially etched segments, as opposed to non-etched segments, of leadframe 250, the overall height of semiconductor dies 204 and 206 in power semiconductor package 200 can be reduced, such that the leg portion employed in conventional conductive clips can be eliminated. In the present implementation, legless conductive clip 252 has a substantially flat body with no leg portion. In contrast to conventional power semiconductor packages having semiconductor dies attached to non-etched lead segments and conductive clips with leg portions, implementations of the present application utilize at least one non-etched segment (e.g., non-etched segment 250a) and partially etched segments (e.g., partially etched segments 250b, 250c and 250d in FIGS. 2B and 2C) of a leadframe to enable semiconductor dies (e.g., semiconductor dies 204 and 206) to couple to each other and to a substrate (e.g., substrate 270) using a legless conductive clip (e.g., legless conductive clip 252). As a result, the overall height of power semiconductor package 200 can be reduced, which in turn reduces the form factor of power semiconductor package 200. Also, by employing legless conductive clip 252 and semiconductor dies 204 and 206 configured for attachment to partially etched segments (e.g., partially etched segments 250b, 250c and 250d in FIGS. 2B and 2C), the thickness of legless conductive clip 252 can be adjusted to improve the current carrying capability to suit the needs of a particular implementation without significantly affecting the overall height of power semiconductor package 200.

In the present implementation, legless conductive clip 252 includes copper. In another implementation, legless conductive clip 252 may include any suitable conductive material, such as aluminum or tungsten. In the present implementation, non-etched segment 250a and partially etched segments 250b, 250c, 250d, 250e and 250f of leadframe 250 may include a metal, such as copper, aluminum, or tungsten, a metal alloy, a tri-metal or other conductive material. In the present implementation, substrate 270 may be a circuit board, such as a printed circuit board (PCB), or any other suitable substrate.

Turning to FIG. 2B, FIG. 2B illustrates a cross-sectional view of an exemplary power semiconductor package, according to one implementation of the present application. In an implementation, FIG. 2B illustrates a cross-sectional view of power semiconductor package 200 along line B-B in FIG. 2A. As illustrated in FIG. 2B, power semiconductor package 200 includes semiconductor die 204 having power switch 220 and driver IC 210 monolithically formed thereon, semiconductor die 206 having power switch 230, leadframe 250 having non-etched segment 250a and partially etched segments 250b, 250c, 250d and 250e, legless conductive clip 252 electrically coupling semiconductor die 204 to semiconductor die 206, and substrate 270.

As illustrated in FIG. 2B, semiconductor die 204 includes driver IC 210 and power switch 220. Power switch 220 includes a control transistor having power electrode 224 (e.g., source electrode) situated on a top surface of semiconductor die 204, and power electrode 222 (e.g., drain electrode) situated on a bottom surface of semiconductor die 204. Power switch 220 also includes a control electrode (e.g., gate electrode) (not explicitly shown in FIG. 2B) that may be situated either on the top or bottom surface of semiconductor die 204 and electrically coupled to driver IC 210. Driver IC 210 is coupled to partially etched segment 250e of leadframe 250 through bond wire 254. Driver IC 210 is configured to provide drive signals to the gates power switch 220 and power switch 230, for example, through bond wires (e.g., bond wire 254), partially etched segments (e.g., partially etched segment 250e), and conductive traces (not explicitly shown in FIG. 2B) on substrate 270.

As illustrated in FIG. 2B, driver IC 210 and power switch 220 are monolithically integrated on semiconductor die 204. In contrast to conventional power semiconductor packages having the driver IC and power switches formed side by side on separate semiconductor dies, the monolithic integration of power switch 220 with driver IC 210 on semiconductor die 204 can advantageously reduce the form factor of power semiconductor package 200. As can be seen in FIG. 2B, power switch 220 has a smaller footprint than that of power switch 230. Thus, integrating driver IC 210 and power switch 220 on the same semiconductor die can reduce the form factor of power semiconductor package 200 more effectively than integrating driver IC 210 and power switch 230 on the same semiconductor die, since the integration of driver IC 210 and power switch 220 on semiconductor die 204 can result in semiconductor die 204 having a footprint smaller than the combined footprint of two separate semiconductor dies, if driver IC 210 and power switch 220 were separately formed on those semiconductor dies.

As illustrated in FIG. 2B, semiconductor die 206 includes power switch 230. Power switch 230 includes a sync transistor having power electrode 232 (e.g., drain electrode) situated on a top surface of semiconductor die 206, and power electrode 234 (e.g., source electrode) and control electrode 236 (e.g., gate electrode) situated on a bottom surface of semiconductor die 206. In the present implementation, power electrode 224 (e.g., source electrode) of power switch 220 is electrically coupled to to power electrode 232 (e.g., drain electrode) of power switch 230 through legless conductive clip 252, which may correspond to switched node 140 in FIG. 1. Legless conductive clip 252 is in turn electrically coupled to substrate 270 through non-etched segment 250a of leadframe 250.

It should be understood that each of power electrode 224 of power switch 220 and power electrode 232 of power switch 230 can be electrically and mechanically coupled to legless conductive clip 252 by a conductive adhesive (not explicitly shown in FIG. 2B). Similarly, power electrode 222 of power switch 220, power electrode 234 and control electrode 236 of power switch 230 can be electrically and mechanically coupled to respective partially etched segments 250d, 250b and 250c of leadframe 250 by a conductive adhesive (not explicitly shown in FIG. 2B). Also, non-etched segment 250a and partially etched segments 250b, 250c, 250d and 250e of leadframe 250 can be electrically and mechanically coupled to substrate 270 by any suitable conductive adhesive material.

As illustrated in FIG. 2B, non-etched segment 250a and partially etched segments 250b, 250c, 250d, 250e and 250f are different portions of leadframe 250, where non-etched segment 250a retains the full thickness of leadframe 250, and partially etched segments 250b, 250c, 250d, 250e and 250f are etched, thus having a fraction of the full thickness of leadframe 250 (e.g., a half or a quarter of the thickness of non-etched segment 250a). In one implementation, partially etched segments 250*b*, 250*c*, 250*d* and 250*e* can be formed by first covering non-etched segment 250*a* with a mask, removing (e.g., by etching) the portions of leadframe 250 not covered by the mask, resulting partially etched segments 250*b*, 250*c*, 250*d* and 250*e* having a substantially uniform thickness, then forming masks over partially etched segments 250*b*, 250*c*, 250*d* and 250*e* and further removing (e.g., by etching through the entire thickness) the portions of leadframe 250 not covered by the masks. As a result, non-etched segment 250*a* and partially etched segments 250*b*, 250*c*, 250*d* and 250*e* of leadframe 250 are physically separated from one another, where non-etched segment 250*a* retains the full thickness of leadframe 250, and partially etched segments 250*b*, 250*c*, 250*d* and 250*e* have a substantially uniform thickness that is a fraction of the full thickness of leadframe 250.

In the present implementation, non-etched segment 250*a* and partially etched segments 250*b*, 250*c*, 250*d* and 250*e* are made of the same material and have a substantially uniform composition. In another implementation, non-etched segment 250*a* and partially etched segments 250*b*, 250*c*, 250*d* and 250*e* can be made of different materials and have different compositions. In the present implementation, partially etched segments 250*b*, 250*c*, 250*d* and 250*e* have a substantially uniform thickness. In another implementation, partially etched segments 250*b*, 250*c*, 250*d* and 250*e* can have different thicknesses.

In the present implementation, because partially etched segments 250*b*, 250*c*, 250*d* and 250*e* of leadframe 250 have a fraction of the full thickness of non-etched segment 250*a*, semiconductor dies 204 and 206 can be attached to partially etched segments 250*b*, 250*c* and 250*d*, for example, resulting in semiconductor dies 204 and 206 having a substantially coplanar top surface with non-etched segment 250*a* of leadframe 250. Also, since semiconductor dies 204 and 206 are situated on partially etched segments, as opposed to non-etched segments, of leadframe 250, the overall height of semiconductor dies 204 and 206 in power semiconductor package 200 can be reduced, such that the leg portion employed in conventional conductive clips can be eliminated. In contrast to conventional power semiconductor packages having semiconductor dies attached to non-etched lead segments and conductive clips with leg portions, power semiconductor package 200 utilizes non-etched segment 250*a* and partially etched segments 250*b*, 250*c* and 250*d* of leadframe 250 to enable semiconductor dies 204 and 206 to couple to each other and to substrate 270 by using legless conductive clip 252. As illustrated in FIG. 2B, legless conductive clip 252 has a substantially flat body having a substantially uniform thickness.

Among other advantages, the monolithic integration of power switch 220 with driver IC 210 on semiconductor die 204 reduces the form factor of power semiconductor package 200. Also, by utilizing partially etched segments 250*b*, 250*c* and 250*d* to couple power switches 220 and 230 to substrate 270, and by coupling power electrode 224 (e.g., source electrode) of power switch 220 and power electrode 232 (e.g., drain electrode) of power switch 230 to substrate 270 through legless conductive clip 252, power semiconductor package 200 can achieve increased current carrying capability and reduced electrical resistance, form factor, complexity, and cost when compared to conventional packaging techniques using exclusively non-etched leadframes in combination with conductive clips with leg portions. Also, the large surface area provided by legless conductive clip 252 allows for more efficient switched current conduction.

Turning to FIG. 2C, FIG. 2C illustrates a cross-sectional view of an exemplary power semiconductor package, according to one implementation of the present application. In an implementation, FIG. 2C illustrates a cross-sectional view of power semiconductor package 200 along line B-B in FIG. 2A. With similar numerals representing similar features in FIG. 2B, power semiconductor package 200 in FIG. 2C includes semiconductor die 204 having power switch 220 and driver IC 210 monolithically formed thereon, semiconductor die 206 having power switch 230, leadframe 250 having non-etched segment 250*a* and partially etched segments 250*b*, 250*c*, 250*d* and 250*e*, legless conductive clip 252 electrically coupling semiconductor die 204 to semiconductor die 206, and substrate 270.

Similar to the power semiconductor package in FIG. 2B, semiconductor die 204 includes driver IC 210 and power switch 220. Power switch 220 includes a control transistor having power electrode 224 (e.g., source electrode) situated on a top surface of semiconductor die 204, and power electrode 222 (e.g., drain electrode) situated on a bottom surface of semiconductor die 204. Power switch 220 also includes a control electrode (e.g., gate electrode) (not explicitly shown in FIG. 2C), which may be situated on either the top or bottom surface of semiconductor die 204. Driver IC 210 is coupled to partially etched segment 250*e* of leadframe 250 through bond wire 254. Driver IC 210 is configured to provide drive signals to the gates of power switches 220 and 230. Similar to the power semiconductor package in FIG. 2B, the monolithic integration of power switch 220 with driver IC 210 on semiconductor die 204 can advantageously reduce the form factor of power semiconductor package 200.

As illustrated in FIG. 2C, semiconductor die 206 includes power switch 230. Power switch 230 includes a sync transistor having power electrode 232 (e.g., source electrode) situated on a top surface of semiconductor die 206, and a power electrode (e.g., drain electrode) and a control electrode (e.g., gate electrode) situated on a bottom surface of semiconductor die 206 (not explicitly shown in FIG. 2A). In the present implementation, power electrode 224 (e.g., source electrode) of power switch 220 is electrically coupled to power electrode 232 (e.g., drain electrode) of power switch 230 through legless conductive clip 252, which corresponds to switched node 140 in FIG. 1. Legless conductive clip 252 is in turn electrically coupled to substrate 270 through non-etched segment 250*a* of leadframe 250.

As illustrated in FIG. 2C, non-etched segment 250*a* and partially etched segments 250*b*, 250*c*, 250*d* and 250*e* are different portions of leadframe 250, where non-etched segment 250*a* retains the full thickness of leadframe 250, and partially etched segments 250*b*, 250*c*, 250*d* and 250*e* are etched, thus having a fraction of the full thickness of leadframe 250 (e.g., a half or a quarter of the thickness of non-etched segment 250*a*). Non-etched segment 250*a* and partially etched segments 250*b*, 250*c*, 250*d* and 250*e* of leadframe 250 are physically separated from one another, and have a substantially uniform thickness.

Similar to the power semiconductor package in FIG. 2B, the combination of non-etched segment 250*a* and partially etched segments 250*b*, 250*c* and 250*d* enables semiconductor dies 204 and 206 to couple to each other and to substrate 270 by using legless conductive clip 252. Also, the overall height of power semiconductor package 200 is reduced due to the utilization of non-etched segment 250*a*, partially etched segments 250*b*, 250*c* and 250*d* of leadframe 250 and legless conductive clip 252, which in turn reduces the form factor of power semiconductor package 200.

As illustrated in FIG. 2C, semiconductor die 204 and semiconductor die 206 have different thicknesses. In the present implementation, semiconductor die 206 having power switch 230 is significantly thinner than semiconductor die 204 having driver IC 210 and power switch 220. In the present implementation, semiconductor die 204 in FIG. 2C has a thickness comparable to that of semiconductor die 204 in FIG. 2B, while semiconductor die 206 in FIG. 2C is significantly thinner than semiconductor die 206 in FIG. 2B. As can be seen in FIG. 2C, non-etched segment 250a of leadframe 250 and semiconductor die 206 have a substantially coplanar top surface. Because the thickness of semiconductor die 206 is thinner than that of semiconductor die 206 in FIG. 2B, and because non-etched segment 250a of leadframe 250 and semiconductor die 206 have a substantially coplanar top surface, non-etched segment 250a of leadframe 250 in FIG. 2C has a reduced thickness that is smaller than the thickness of non-etched segment 250a in FIG. 2B. Thus, the overall height of power semiconductor package 200 is further reduced in FIG. 2C as compared to the power semiconductor package in FIG. 2B.

In the present implementation, legless conductive clip 252 has non-etched portion 252a and partially etched portion 252b. Partially etched portion 252b of legless conductive clip 252 is configured to provide clearance for semiconductor die 204, such that power electrode 224 (e.g., source electrode) of power switch 220 can be electrically and mechanically coupled to partially etched portion 252b of legless conductive clip 252. As compared to the power semiconductor package in FIG. 2B, the reduction in thickness of semiconductor die 206 with legless conductive clip 252 having partially etched portion 252b can reduce the overall height of power semiconductor package 200 in FIG. 2C, since partially etched portion 252b of legless conductive clip 252 above semiconductor die 204 has a reduced thickness as compared to the portion of legless conductive clip 252 above semiconductor die 204 in FIG. 2B. In addition, by employing legless conductive clip 252 having partially etched portion 252b and semiconductor dies 204 and 206 configured for attachment to partially etched segments 250b, 250c and 250d of leadframe 250, the thickness of legless conductive clip 252 can be adjusted to improve the current carrying capability to suit the needs of a particular implementation without significantly affecting the overall height of power semiconductor package 200. Also, the large surface area provided by legless conductive clip 252 allows for more efficient switched current conduction.

Figure 3:
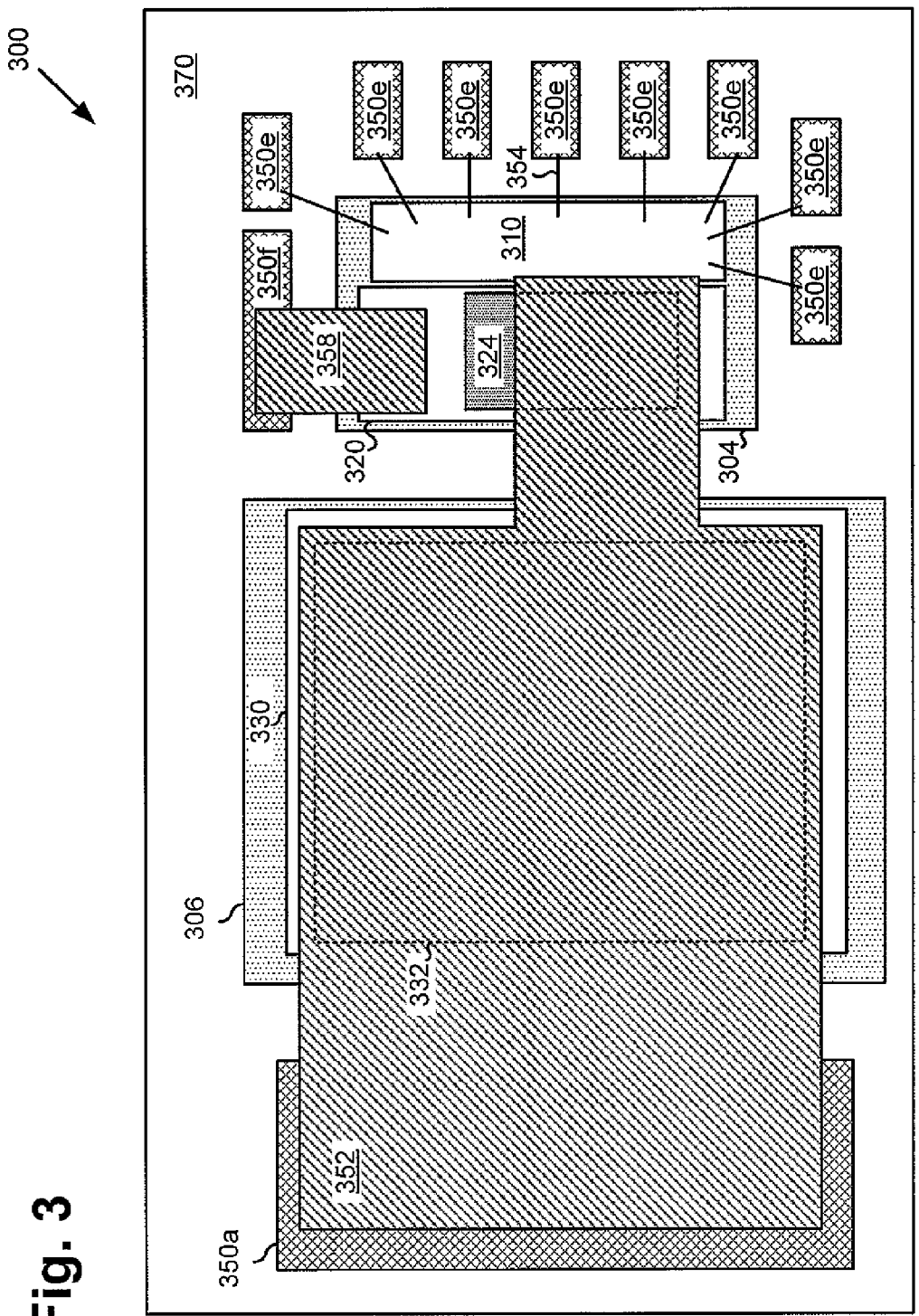
FIG. 3 illustrates a top plan view of an exemplary power semiconductor package, according to one implementation of the present application.

Turning to FIG. 3, FIG. 3 illustrates a top plan view of an exemplary power semiconductor package, according to one implementation of the present application. As illustrated in FIG. 3, power semiconductor package 300 includes semiconductor die 304 having power switch 320 and driver IC 310 monolithically formed thereon, semiconductor die 306 having power switch 330, leadframe 350 having non-etched segment 350a and partially etched segments (e.g., partially etched segments 350e and 350f), legless conductive clip 352, and substrate 370.

In the present implementation, driver IC 310 and power switch 320 on semiconductor die 304, and power switch 330 on semiconductor die 306 may correspond to driver IC 110 and power switch 120 on semiconductor die 104, and power switch 130 on semiconductor die 106, respectively, in power converter circuit 100 of FIG. 1, and are connected as such. In the present implementation, semiconductor die 304 having power switch 320 and driver IC 310, semiconductor die 306 having power switch 330, non-etched segment 350a and partially etched segments 350e and 350f of leadframe 350, legless conductive clip 352, and substrate 370 may correspond to semiconductor die 204 having power switch 220 and driver IC 210, semiconductor die 206 having power switch 230, non-etched segment 250a and partially etched segments 250e and 250f of leadframe 250, legless conductive clip 252, and substrate 270 in FIG. 2A, respectively.

In contrast to power semiconductor package 200 in FIG. 2A where one or more bond wires 256 are utilized, as illustrated in FIG. 3, conductive clip 358 is configured to electrically couple a power electrode (e.g., drain electrode) of power switch 320 at the bottom of semiconductor die 304 to an input voltage (e.g., positive output terminal 164, $V_{OUT(+)}$ in FIG. 1) through one or more through-substrate vias (not explicitly shown in FIG. 3) in semiconductor die 304. In the present implementation, conductive clip 358 is a legless conductive clip. In another implementation, conductive clip 358 may include a leg portion.

As illustrated in FIG. 3, since semiconductor dies 304 and 306 are situated on partially etched segments, as opposed to non-etched segments, of leadframe 350, the overall height of semiconductor dies 304 and 306 in power semiconductor package 300 can be reduced, such that the leg portion employed in conventional conductive clips can be eliminated. In the present implementation, legless conductive clip 352 has a substantially flat body with no leg portion. In contrast to conventional power semiconductor packages having semiconductor dies attached to non-etched lead segments and conductive clips with leg portions, implementations of the present application utilize at least one non-etched segment (e.g., non-etched segment 350a) and partially etched segments (e.g., similar to partially etched segments 250b, 250c and 250d in FIGS. 2B and 2C) of a leadframe to enable semiconductor dies (e.g., semiconductor dies 304 and 306) to couple to each other and to a substrate (e.g., substrate 370) using a legless conductive clip (e.g., legless conductive clip 352). As a result, the overall height of power semiconductor package 300 can be reduced, which can in turn reduce the form factor of power semiconductor package 300. Also, by employing legless conductive clip 352 and semiconductor dies 304 and 306 configured for attachment to partially etched segments, the thickness of legless conductive clip 352 can be adjusted to improve the current carrying capability to suit the needs of a particular implementation without significantly affecting the overall height of power semiconductor package 300. Thus, among other advantages, power semiconductor package 300 can achieve increased current carrying capability and reduced electrical resistance, form factor, complexity, and cost when compared to conventional packaging techniques using exclusively non-etched leadframes in combination with conductive clips with leg portions. Also, the large surface area provided by legless conductive clip 352 allows for more efficient switched current conduction. Additionally, the large surface area provided by conductive clip 358 allows for more efficient input current conduction.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A power semiconductor package comprising:
   a leadframe having partially etched segments and at least one non-etched segment;
   a first semiconductor die having a first power transistor and a driver integrated circuit (IC) monolithically formed thereon;
   a second semiconductor die having a second power transistor; and
   a legless conductive clip that has a partially etched portion, and that has a length along a surface that is common to said partially etched portion and a non-etched portion that extends from said partially etched portion;
   wherein said first semiconductor die and said second semiconductor die are configured for attachment to said partially etched segments;
   wherein partially etched segments and said at least one non-etched segment enable said first semiconductor die to be coupled to said second semiconductor die by said legless conductive clip.

2. The power semiconductor package of claim 1, wherein a power electrode of said first power transistor is coupled to a power electrode of said second power transistor by said legless conductive clip.

3. The power semiconductor package of claim 1, wherein said first power transistor is a control transistor, and said second power transistor is a sync transistor in a buck convertor.

4. The power semiconductor package of claim 1, wherein at least one of said first power transistor and said second power transistor includes silicon.

5. The power semiconductor package of claim 1, wherein at least one of said first power transistor and said second power transistor includes gallium nitride (GaN).

6. The power semiconductor package of claim 1, wherein at least one of said first power transistor and said second power transistor is selected from the group consisting of a field-effect transistor (FET), an insulated gate bipolar transistor (IGBT) and a high electron mobility transistor (HEMT).

7. The power semiconductor package of claim 1, wherein said legless conductive clip includes copper.

8. The power semiconductor package of claim 1, wherein said legless conductive clip has a substantially uniform thickness.

9. The power semiconductor package of claim 1, wherein said legless conductive clip electrically couples said first semiconductor die and said second semiconductor die to said at least one non-etched segment of said leadframe.

10. The power semiconductor package of claim 1, wherein said first semiconductor die is configured for attachment to a first partially etched segment of said partially etched segments and said second semiconductor die is configured for attachment to a second partially etched segment, of said partially etched segments, that is different than said first partially etched segment, and wherein said first and second partially etched segments and said at least one non-etched segment enable said first semiconductor die to be coupled to said second semiconductor die by said legless conductive clip.

11. The power semiconductor package of claim 1, wherein said legless conductive clip has another surface and a power electrode of said first power transistor, and a power electrode of said second power transistor, is coupled to said legless conductive clip along said another surface.

12. A power semiconductor package comprising:
    a leadframe having partially etched segments and at least one non-etched segment;
    a first semiconductor die having a first power FET;
    a second semiconductor die having a second power FET; and
    a legless conductive clip that has a flat body and a substantially uniform thickness;
    wherein said first semiconductor die and said second semiconductor die are configured for attachment to said partially etched segments and said partially etched segments of said lead frame have a substantially uniform thickness;
    wherein said partially etched segments and said at least one non-etched segment enable said first semiconductor die to be coupled to said second semiconductor die by said legless conductive clip.

13. The power semiconductor package of claim 12, further comprising a driver integrated circuit (IC) monolithically formed with said first power FET on said first semiconductor die.

14. The power semiconductor package of claim 12, wherein a source electrode of said first power FET is coupled to a drain electrode of said second power FET by said legless conductive clip.

15. The power semiconductor package of claim 12, wherein said first power FET is a control transistor, and said second power FET is a sync transistor in a power convertor.

16. The power semiconductor package of claim 12, wherein at least one of said first power FET and said second power FET includes a silicon FET or a GaN FET.

17. The power semiconductor package of claim 12, wherein said legless conductive clip includes copper.

18. The power semiconductor package of claim 12, wherein said legless conductive clip has a partially etched portion.

19. The power semiconductor package of claim 12, wherein said legless conductive clip electrically couples said first semiconductor die and said second semiconductor die to said at least one non-etched segment.

20. The power semiconductor package of claim 12, wherein said first semiconductor die is configured for attachment to a first partially etched segment of said partially etched segments and said second semiconductor die is configured for attachment to a second partially etched segment, of said partially etched segments, that is different than said first partially etched segment, and wherein said first and second partially etched segments and said at least one non-etched segment enable said first semiconductor die to be coupled to said second semiconductor die by said legless conductive clip.

* * * * *